United States Patent [19]

Higuchi et al.

[11] 4,029,564
[45] June 14, 1977

[54] HIGH SPEED PLATING DEVICE FOR RECTANGULAR SHEETS

[75] Inventors: Kazuhiro Higuchi, Hatano; Junichi Tezuka, Isehara, both of Japan

[73] Assignee: Electroplating Engineers of Japan, Limited, Tokyo, Japan

[22] Filed: Mar. 26, 1976

[21] Appl. No.: 670,684

[52] U.S. Cl. .......................... 204/224 R; 204/275
[51] Int. Cl.² ...................................... C25D 17/06
[58] Field of Search ............... 204/275, 224 R, 225

[56] References Cited

UNITED STATES PATENTS

| | | | |
|---|---|---|---|
| 1,416,929 | 5/1922 | Bailey | 204/224 R |
| 3,071,521 | 1/1963 | Ehrhart | 204/224 R |
| 3,763,027 | 10/1973 | Pearson | 204/224 R |
| 3,880,725 | 4/1975 | Van Raalte et al. | 204/DIG. 7 |
| 3,933,615 | 1/1976 | Levenson | 204/275 |

*Primary Examiner*—T. M. Tufariello
*Attorney, Agent, or Firm*—Woodhams, Blanchard and Flynn

[57] ABSTRACT

A plating device suitable for performing high speed, gold-, nickel-, rhodium- platings on a rectangular sheet such as a printed circuit board is provided with a mechanical masking means and a plating solution jetting means.

8 Claims, 5 Drawing Figures

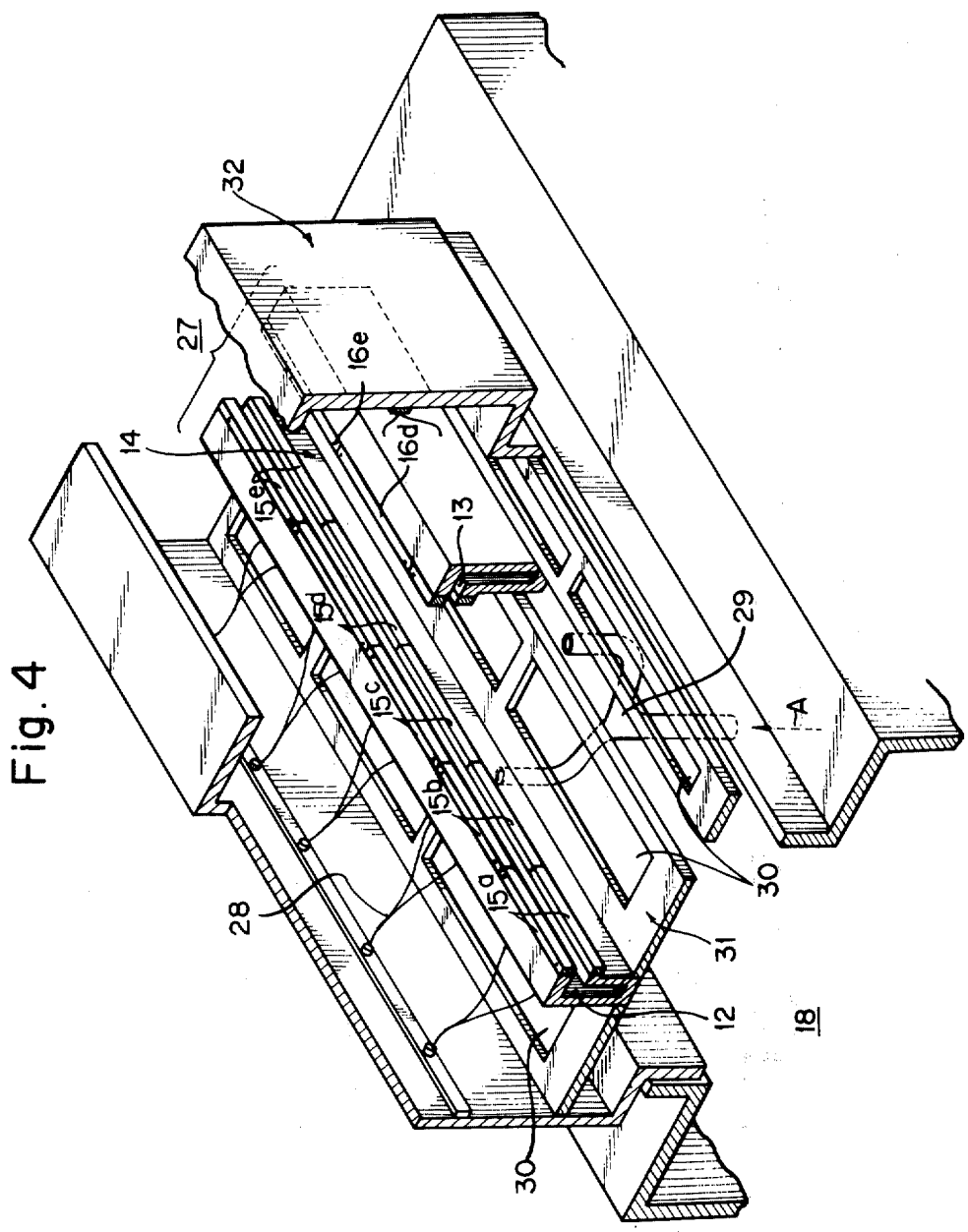

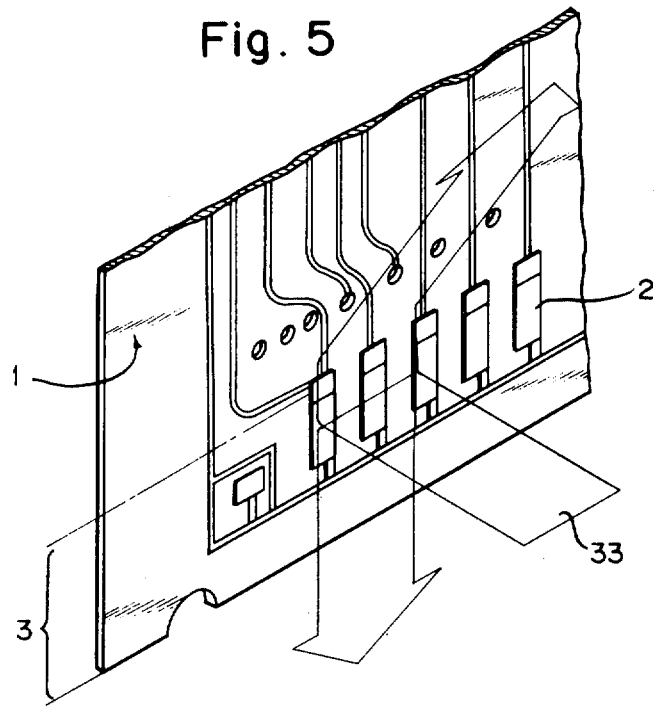

HIGH SPEED PLATING DEVICE FOR RECTANGULAR SHEETS

FIELD OF THE INVENTION

The present invention concerns a high speed plating device for rectangular sheets, and more in particular it concerns a plating device which has an improved masking means and which uses an improved method of supplying the plating solution. Terminals of the copper plated, printed circuit board are generally imparted with the features as terminals — hardness, wear resistance, electric properties, etc. — by directly applying gold plating, or gold or rhodium plating over the nickel plating on the surface.

BACKGROUND OF THE INVENTION

In the prior art, a plating method for terminals of the printed circuit board is known wherein the portions of the board which need not be plated is covered with a thin synthetic resin film and the peripheral portions are masked with adhesive tapes or resist material, and the board is dipped in the level controlled electroplating bath and charged with electricity for plating. However, this type of method requires preliminary preparations prior to the plating operation which automatically increase the costs in labour and materials. Plating at a high current density is impossible for this dipping method so that it takes a long period of time to obtain the required minimum thickness of the plated deposit. This method is further defective in that the thickness of the plating deposit is often uneven depending on the location of the object to be plated, distance between anodes and cathodes, and on the condition of electrolyte agitation and also in that these conditions are very hard to control.

The present invention was contrived so as to remove these defects by improving the masking means and by jetting the plating solution on the surface of the objects to be plated instead of dipping the object in the bath as in the prior art, thereby securing a plating device which performs the plating operation simply, securely and at a high speed.

The present invention aims at eliminating all the consumable materials such as resists or tapes which are required to protect the portions not requiring plating and at radically decreasing the labor and material costs by conducting the mechanical masking for the non-plated parts simultaneously with the plating operation.

Another object of the present invention is to remarkably reduce the area needed for installation of the plating device and to decrease the unevenness in the plating film at respective plated portions and on two faces by utilizing the constant jetting method.

Further objects of the present invention will become clear from the following explanation and the attached drawings.

BRIEF DESCRIPTION OF THE DRAWINGS

One embodiment of the present invention is explained references being made to the drawing in which

FIG. 4 is a partial oblique view showing an exploded view of a jetting means and FIG. 5 is a diagram showing the plating solution being jetted.

DETAILED DESCRIPTION

Figure 1:
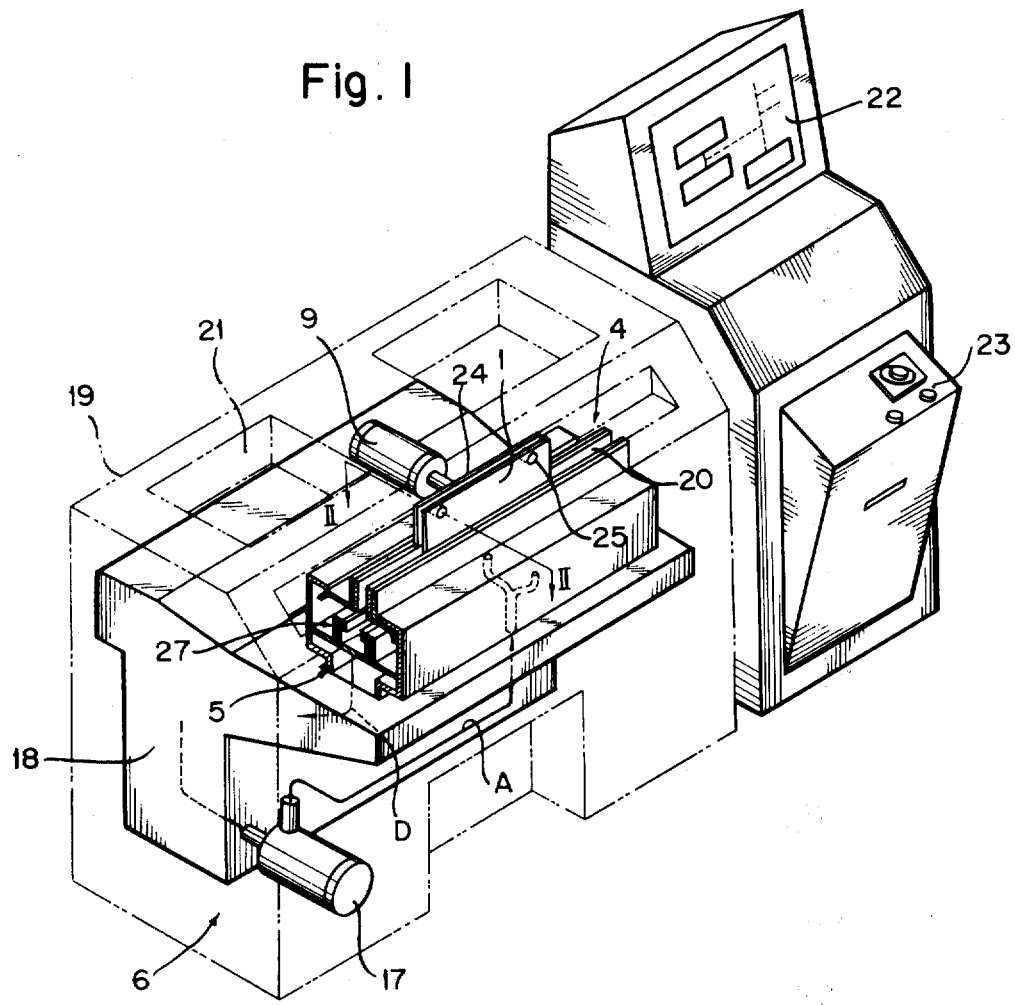
FIG. 1 is a diagramatic oblique view showing an over-all view of the high speed plating device with its main parts exploded.
Figure 2:
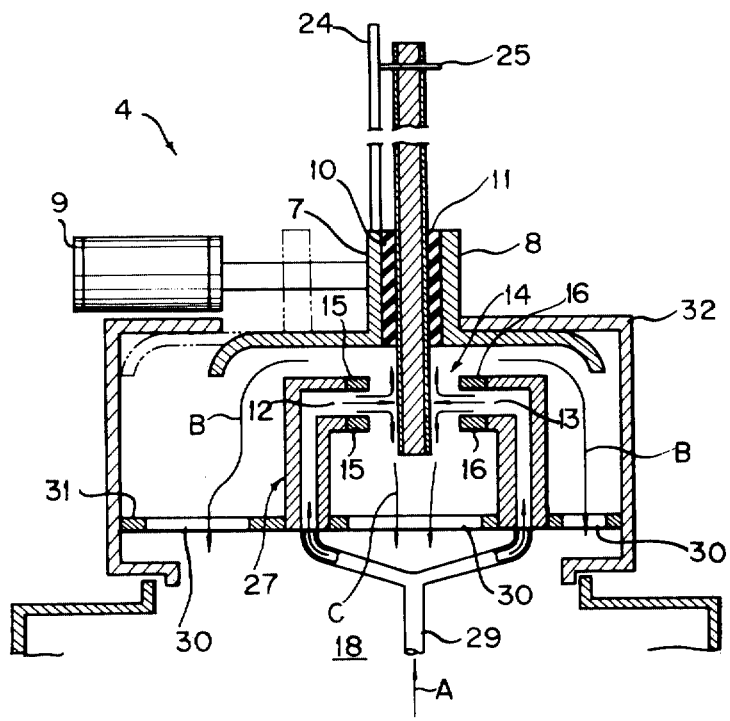
FIG. 2 is a cross sectional view taken along the line II—II in FIG. 1.

In the drawing, 1 denotes a printed circuit board shown as an example of the rectangular sheet and 2 terminals aligned in the longitudinal direction of the bottom of the board 1 which are denoted also as 3, the portion to be plated.

Figure 3:
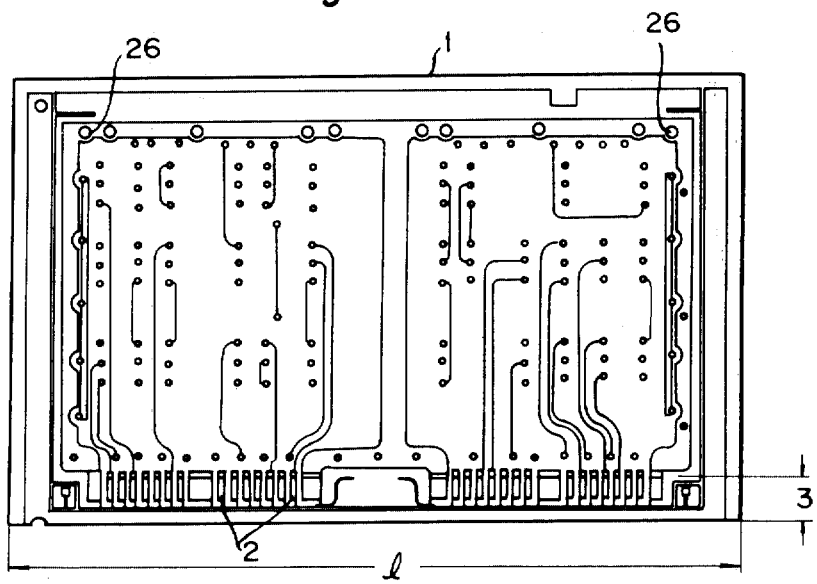
FIG. 3 is a front view showing a printed circuit board used as one example of the rectangular sheet.

The device in accordance with the present invention which plates the printed circuit board 1 as above described at a high speed comprises a masking means 4, a jetting means 5 and a circulating/feeding means for the plating solution. The masking means 4 is provided with a press plate 7 and a receiving plate 8 which makes up a pair and a pressure cylinder 9. This pair of press plate 7 and receiving plate 8 has a length exceeding that of the printed circuit board 1 and is provided on its opposing faces with masking sheets 10, 11 respectively. The masking sheets 10, 11 are made of rubber or some other material suitable for masking and acts also as a packing material. Above the said press plate 7 is positioned an upright guide scale plate 24, which has two pins 25 attached in such a way that the attaching position may be varied. As the printed circuit board 1 is invariably provided with a plurality of holes 26 (FIG. 3), the printed circuit board 1 may be hooked and hung by passing the pins 25 through these holes 26, and it is possible to adjust the position of the portions to be plated 3 relative to the plating liquid slit jet member, or the depth of the printed circuit board 1 relative to the jetting means 5 when the printed circuit board 1 is hung over the pins 25 by these holes. It is also possible to plate other types of printed circuit boards so long as the shape is the same without adjusting the positions; it is sufficient if the board is merely hung over the pins 25 of the guide scale plate 24. Instead of this "hanging method", the lower end of the printed circuit board may be supported by a support fixture of which the height is adjustable. The pressure cylinder 9 presses the press plate 7 toward the receiving plate 8 and the printed circuit board 1 is supported by the pressure between the press plate 7 and the receiving plate 8. If no pressure is applied, the printed circuit plate 1 can be removed freely from between the press plate 7 and the receiving plate 8 or conversely it may be placed therebetween. It is sufficient if at least one of the said pair of press plate 7 and receiving plate 8 can be moved for "pressurizing", but it is also possible to attach pressure cylinders to both of them for pressurizing.

The jetting means 5 comprises a nozzle member 27 having a specific structure and other accessories. At the top of the said nozzle member 27 there is provided an opening 14 to receive the portions to be plated 3 of the printed circuit board 1 and on both sides of the said opening 14 are positioned opposite each other and along the longitudinal direction two slit jet members 12, 13 for the plating solution. There are provided chargeable anodes 15, 16 on the said jet member 12, 13 all the way along the lengthwise edges thereof as shown in FIG. 4, sectioned into plural sections 15a–15e, 16d, 16e and connected with a lead wire 28 respectively. Sectioning of the anode is quite important in maintaining the current density constant.

To the bottom of the said nozzle member 27 is attached a Y shaped pipe 29 joined to the piping through which the plating solution is instantly supplied to the jet members 12, 13. The nozzle member 27 is supported within a case 32 by a support plate 31 formed with a plurality of openings 30. The bottom of the case 32 is left open. The circulating/feeding means 6 for the plating solution comprises a pump 17, a plating solution tank 18 and various pipings. The tank 18 is open at the top to directly receive the bottom (opening) of the case 32 so that the plating solution jetted from the jet members 12, 13 does not remain in the case 32 but is returned to the tank 18 immediately through the openings 30 of the support plate 31 and the bottom opening of the case 32.

In the drawing, 19 denotes a housing for the device provided on its upper part with a slit 20 for allowing the printed circuit board 1 to be inserted and a storage recess 21 for containing the objects to be plated. 22 is an indicator panel while 23 is a control panel for plating.

The operations of the high speed plating device as above mentioned are now explained. With the pressure cylinder 9 turned "OFF", the printed circuit board 1 is hung by hooking the same to the guide scale sheet 24 having two pins 25 and the bottom end of the board is inserted between the press plate 7 and the receiving plate 8. Then, with the pressure cylinder 9 turned "ON", the printed circuit board 1 is supported between the press plate 7 and the receiving plate 8. The portion of the printed circuit board 1 which does not receive plating is mechanically, simply and securely masked with the masking sheets 10, 11 of both the press plate and the receiving plate and the unmasked portion 3 of the said board 1 which is to be plated is inserted into the opening 14 of the nozzle member 27 and positioned between the jet members 12, 13 for the plating solution. Electricity is charged to the terminals 2 as cathodes, and while charging anodes 15, 16, the circulating-/feeding means 6 of the plating solution is operated. The plating solution flows under pressure from the pump 17 along the direction of arrow A (FIG. 1) through the Y shaped pipe 29 to the nozzle member 27 and is jetted instantly against the two surfaces to be plated through the two jet members 12, 13. Jetted plating solution 33 advances toward the object to be plated 3 as shown in FIG. 5 in the perpendicular direction (horizontal direction) and diverges into upward and downward streams as it crashes upon the surfaces. This phenomenon occurs instantly and simultaneously throughout the whole length of the portions to be plated 3 of the rectangular sheet. When the plating solution 33 contacts the portion to be plated 3, ionization occurs instantly and a uniform plated layer is achieved at a high speed. In this case, it is possible to selectively charge the anodes 15a–15e, 16d, 16e sectioned into a plural number corresponding to the length of the portions to be plated, and the readiness to correspond to the anodes 15, 16 in plating various printed circuit boards is improved and the electric current density can be controlled to be uniform.

Plating solution after the plating is completed flows in the direction of arrows B and C and is rapidly recovered into the tank 18 through the bottom opening of the case 32. The solution is then cycled and reused as the need arises.

The high speed plating device for rectangular sheet in accordance with the present invention as above mentioned achieves various advantages enumerated below.

a. Plating is completed by jetting the plating solution, thereby facilitating a use under a high electric current density.

This means the plating speed is about 5 times more ($15$ A/dm$^2$, 14 sec., 1 $\mu$) than that of the conventional dipping system (3 A/dm$^2$, 70 sec., 1 $\mu$).

b. Uniform jetting will achieve an even plating film thickness.

c. Since no masking materials such as resists and tapes are required, it becomes possible to reduce the number of steps in the operation, and to mechanically secure the sheet for plating only the required portions at once from both sides.

d. Since plating at a high speed is possible, the area needed for installation can radically be reduced for the same quantity production.

e. As the consumables for masking are no longer required, the plating time is shortened, the production per hour increased and contamination of the plating solution by masking agents avoided.

f. Soiling of the printed circuit board by dissolved lead, tin, etc. during soldering in the conventional dip plating is avoided since plating is performed at a high speed. This prolongs the life of the plating solution remarkably.

g. The additional advantage of this invention is that the gold plating over soldering is obtainable as a precipitate in an excellent condition by the high speed plating which is the major characteristic feature of the present invention.

Since the present invention offers plating of specific areas on both sides at the same time, let alone on one side, of the rectangular sheets which are not limited to the printed circuit board, such parts as connectors and contacts can also be processed in accordance with the present invention.

What we claim is:

1. A plating device for plating a selected lengthwise portion of a sheet-like article, comprising:

masking means for masking portions on opposite sides of the article which are not to be plated, said masking means including a pair of opposed plates having masking sheets on the facing sides thereof, said plates having a length corresponding to the length of the article, and pressure cylinder means coacting with said plates for causing relative movement therebetween so that said article can be pressed between the plates whereby the masking sheets cover portions of the article which are not to be plated, said masking means leaving lengthwise portions located on opposite faces of the article exposed for plating;

jetting means for simultaneously and uniformly applying a plating solution to the exposed lengthwise portions of the article which are disposed on the opposite faces thereof, said jetting means including a pair of nozzle members which are spaced apart and are directed toward one another for permitting the article to be disposed therebetween, whereby each of the nozzle members jets the plating solution against the exposed lengthwise portion on one side of the article;

each nozzle member having a discharge opening means which is elongated in the lengthwise direction of the article and oriented to direct the discharged stream of plating solution in a direction substantially perpendicular to the exposed lengthwise portion of the article so that the stream of plating solution, upon impacting against the exposed lengthwise portion of the article, divides substantially uniformly into substreams which flow outwardly in opposite directions over the exposed lengthwise portion of the article for effecting plating thereof;

anode means associated with each of said nozzle members, said anode means being positioned at the edge of said nozzle member so as to define said discharge opening means, said anode means being positioned along both edges of said discharge opening means and extending in the elongated direction thereof so as to extend in the lengthwise direction of the article; and means for supplying plating solution to said jetting means.

2. A plating device according to claim 1, wherein said anode means comprises a pair of anode members which extend lengthwise along the opposite edges of the discharge opening means, each of said anode members being divided in the longitudinal direction thereof into a plurality of separate anode parts which can be selectively and independently electrically charged.

3. A plating device according to claim 1, including a casing for surrounding the nozzle members and part of the article for confining the plating solution, said casing being open at the top for permitting the article to be suspended into the casing between the nozzle members, said masking means being disposed adjacent the top of said casing, and opening means associated with the bottom of said casing for permitting collection and recirculation of the plating solution.

4. A plating device according to claim 3, including tank means for collecting therein the plating solution, said tank means being disposed directly beneath said casing so that the plating solution circulating within said casing falls downwardly through the opening means associated with the bottom thereof so as to be collected in said tank means, and said means for supplying the plating solution to said jetting means including conduit means extending between said tank means and said nozzle members.

5. A plating device according to claim 3, wherein each of said nozzle members is elongated horizontally of the casing and is of a generally inverted L-shaped cross-sectional configuration, each nozzle member including a vertically extending leg portion which is fixed to the bottom of the casing and projects upwardly therefrom and has the upper end thereof connected to a substantially horizontally extending leg portion which terminates in said discharge opening means, the horizontal leg portions of the nozzle members projecting toward one another and being spaced apart so as to define an elongated slot therebetween which extends substantially horizontally in parallel relationship to the horizontally elongated direction of the nozzle members, said sheet-like article being suspended above the casing so that a lower portion thereof can project downwardly into the casing and into the elongated slot so as to be positioned between the nozzle members, and said anode means comprising a pair of elongated anode members which extend horizontally in the lengthwise direction of the respective nozzle member and are positioned adjacent and extend lengthwise along the upper and lower edges of the respective discharge opening means.

6. A plating device according to claim 1, including guide sheet means associated with one of the plates to control the positioning of the article relative to the nozzle members, said guide sheet means having holding means associated therewith for engaging the article to hold same in an upright position whereby the lower portion of the article is suspended between the nozzle members.

7. A plating device according to claim 1, wherein said jetting means includes a main supply conduit for supplying said plating solution, said main supply conduit branching into two identical secondary conduits which are respectively connected to the nozzle members, whereby uniform quantities of plating solution are supplied to both nozzle members.

8. A plating device according to claim 7, wherein the secondary conduits and the nozzle members are symmetrically positioned on opposite sides of a vertical plane and define an upwardly opening region therebetween for permitting a lower portion of the article to be suspended into said region so that the exposed lengthwise portions located on opposite faces of the article are disposed between the opposed nozzle members, and said masking means being spaced above the nozzle members for engaging opposite sides of the article.

* * * * *